United States Patent [19]

Scasciafratti

[11] Patent Number: 5,790,038
[45] Date of Patent: Aug. 4, 1998

[54] SYSTEM FOR THE REMOTE MEASURING OF THE PROTECTION GROUND

[76] Inventor: Gianfranco Scasciafratti, Via Ferdinando Palasciano 107, Rome, Italy, 00151

[21] Appl. No.: 732,354
[22] PCT Filed: Apr. 10, 1995
[86] PCT No.: PCT/IT95/00052
  § 371 Date: Oct. 22, 1996
  § 102(e) Date: Oct. 22, 1996
[87] PCT Pub. No.: WO95/29408
  PCT Pub. Date: Nov. 2, 1995

[30] Foreign Application Priority Data

Apr. 22, 1994 [IT] Italy ................. RM94A0224

[51] Int. Cl.[6] ................................................. B60Q 1/00
[52] U.S. Cl. .......................... 340/649; 340/660; 340/664; 324/510; 324/691; 324/714
[58] Field of Search ...................... 340/649, 660, 340/664, 870.01, 870.07, 870.16, 870.18; 324/72, 510, 691, 713, 714, 715, 719

[56] References Cited

U.S. PATENT DOCUMENTS 3,913,010  10/1975  Scarpino ................. 324/509
4,529,929  7/1985  Berggren ................. 324/52
4,947,469  8/1990  Vokey et al. ............. 324/523
5,365,179  11/1994  Rogers ................... 324/509

FOREIGN PATENT DOCUMENTS 0 082 103   6/1983   European Pat. Off. .

OTHER PUBLICATIONS

Patent Abstracts of Japan, vol. 8, No. 196 (P-299) [1633], & JP.A.59 084166, 8 Nov. 1982.

Primary Examiner—Thomas J. Mullen, Jr.
Assistant Examiner—Daniel J. Wu
Attorney, Agent, or Firm—Bell Seltzer Intellectual Property Law Group of Alston & Bird LLP

[57] ABSTRACT

A system for the remote measurement of the protection ground associated with an electrical system, and which employs a telephone line for the transmission of the control signals and the results of the measurement. The system includes a centralized ground measuring device (1) having two reference grounds (11, 12) which are connected to the soil, a line selector (2) and remote actuators (3) which also include two ground terminals which are connected to the soil and which may be located near the region in which the measurement is required.

7 Claims, 4 Drawing Sheets

5,790,038

SYSTEM FOR THE REMOTE MEASURING OF THE PROTECTION GROUND

TECHNICAL FIELD

The present invention generally relates to a system for the remote measuring of the protection ground associated to any kind of electric system, for civil or industrial use, and in particular it refers to a remote detecting system of the protection ground which employs a telephone line as support for the transmission of the control signals and of the quantities associated to this measurement.

BACKGROUND ART

The protection ground electric system is used in order to bring part of a metallic structure of an electric/electronic device as much as possible to a value corresponding to the ground potential, when for some unusual reasons (anomalous contacts, failure, atmospheric discharges, etc.), a potential is applied to the metallic structure that can cause damage to the safety of a person.

The lower the value of the ground resistance, the safer is the protection.

Since often it may be very difficult and expensive to obtain low values of the resistance, the law requires values of the ground resistance depending on the use and the possible discharge currents.

Since the ground resistance is used only during certain periods and since its value may vary also considerably due to the aging of the electric system or to changes in environmental conditions, a periodic control of the ground resistance is necessary in order to guarantee, in every condition, a value which is always lower than that established by the law.

The measurement of the ground resistance is performed by means of portable instruments, using stakes driven into the ground, in different ways, but usually relying on the volt-ammeter method.

In order to perform this operation, one has to reach the region of measure and drive the stakes into the ground by following appropriate rules.

The above described practice often implies also noticeable difficulties which render problematic a measurement which is already expensive, and which must be carried out anyway respecting terms provided by the law.

Moreover, the ground measurements performed according to the conventional technique using the volt-ammeter method employ detection stakes located at a distance of 20/40 m from each other. In this manner, the electric current which is involved in the measurement in part flows through the surface layer of the ground and does not involve the equipotential region which lies in the deeper layers.

Therefore, the measurement is influenced by the detection of a ground surface resistance which apparently is very low and does not correspond to the actual one, and since said apparent ground resistance is lower than the actual ground resistance, a safety coefficient will be deduced, according to the ground resistance, which is fictitious and overestimated; but this is extremely dangerous.

DISCLOSURE OF INVENTION

The object of the present invention is that of providing a system which allows the remote measuring of the ground resistance without forcing an operator to move and in extremely short times.

A further object of the present invention is that of providing a remote measuring system of the protection ground, which allows to operate at very deep soil layers, thereby increasing the precision of the measurement.

Finally, an object of the present invention is to provide a remote measuring system of the protection ground, which is easy to use and which has a limited cost.

These objects and other ones which will become apparent as the description proceeds, are achieved through a remote measuring system of the protection ground comprising a centralized ground measuring device, remote controlled actuators which comprise ground terminals connected to the soil and a line selector which connects the centralized ground measuring device with the remote controlled actuators by means of two wires.

This remote controlled actuator is provided with contacts to connect the wires of the line to the ground terminals for closing the measurement circuit and is located near the region where said ground measurement is required, whereby said ground resistance measurement is done in measurement region which is very distant from the reference grounds. The centralized ground measuring device comprises an address transmitter emitting a synchronism and recognition signal and for suppling current to the line, a constant current generator which provides a current flowing into the ground resistance closing itself in the measuring device, passing through a current probe which is suited to detect the closing of the measurement circuit, and a change-over switch connecting the second wire of the line either to a second output of the address transmitter, a first output of which is connected to the first wire of the line, or to a second input of a selective voltmeter a first input of which is connected to a second reference ground.

BRIEF DESCRIPTION OF DRAWINGS

The features of the invention will be more clearly understood from the following description of a practical configuration of the invention, to be considered together with the annexed drawings, in which.

BEST MODE OF CARRYING OUT THE INVENTION

Figure 1:
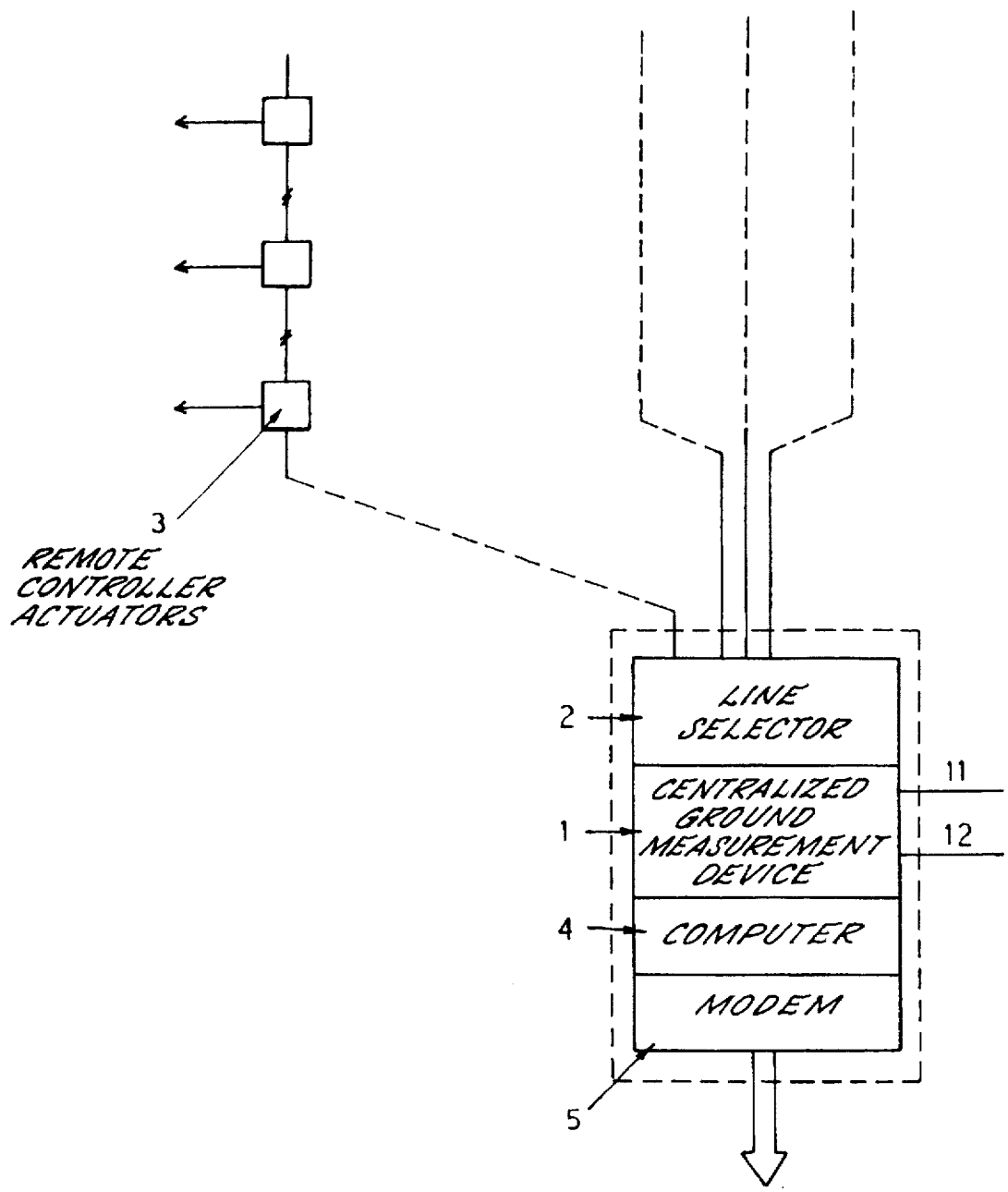
FIG. 1 is a block diagram of the whole remote detection system.

In FIG. 1, which shows the block diagram of the entire system, a centralized ground measurement device 1 is connected to two reference grounds 11 and 12 and in order to enlarge the measuring possibilities, a line selector 2 permits to choose among different measuring lines. On each line there are disposed remote controlled actuators 3 which following a control, connect the ground to be measured with the centralized measuring device. As transmission means it is possible to use any kind of double wire, and in the following we refer to a telephone line only because it is already diffused in a capillary way and already implemented. The measured data may be treated by a computer 4 and possibly sent to a supervisory center by means of a modem 5.

Figure 2:
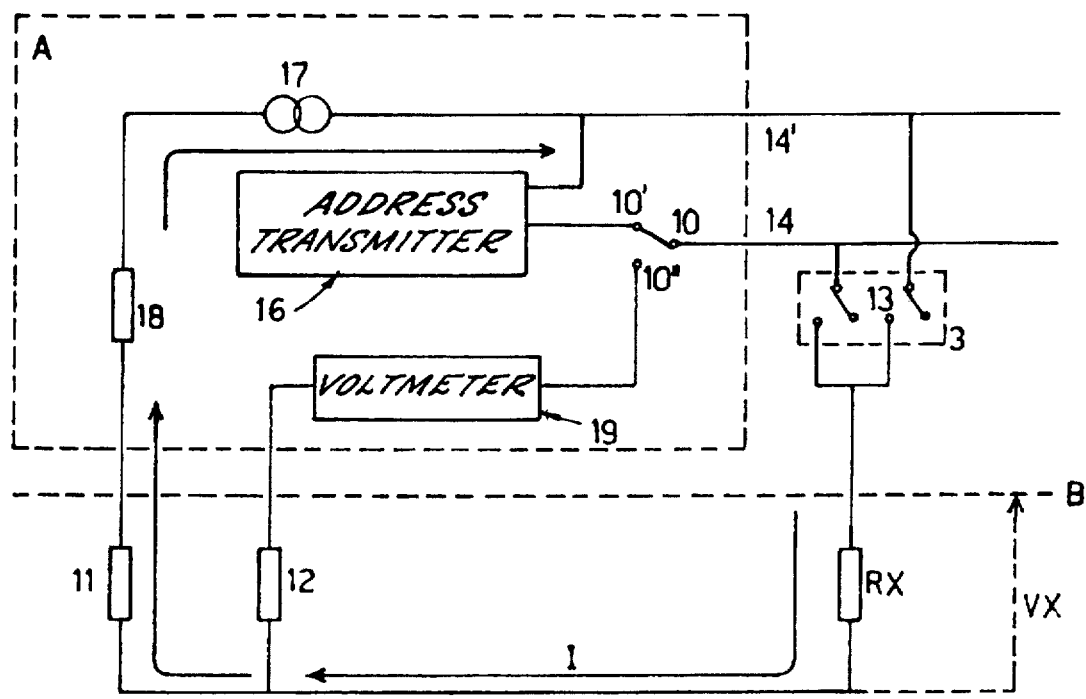
FIG. 2 is a representation of the actual ground measuring device corresponding to an exploded view of the block 1 of FIG. 1.

In FIG. 2 there is shown a block diagram corresponding to the centralized measuring device 1 of FIG. 1, and while A indicates in dotted line the centralized measuring device on its own, the dotted line B indicates the soil on which the measurement is performed.

For this measuring device the operation phases and the features of the single blocks comprise:

I) an address transmitter 16 which sends a synchronism and recognition signal and at the same time supplies the line 14, 14'.

II) The remote controlled actuator 3 is supplied, and if it recognizes the transmitted address, it closes the contacts 13 for a time which exceeds the measuring time.

III) A constant current I which is generated by an appropriate generator 17 flows in the resistance RX and then closes itself passing through the measuring device and a current probe 18.

When the probe 18 detects the current, it moves the change-over switch 10 from position 10' to position 10". From this time on, the actual measuring is carried out; the selective voltmeter 19, because of its high impedance, may be practically considered to be connected to the ends of RX, so that:

RX=VX/I since I is constant the measured value of VX is directly proportional to the value of RX.

It must be noted that the value of the two reference grounds 11 and 12 and the length of the line does not influence the measurement, so that these quantities may also be unknown.

The generator 17 generates an alternate current with a very low frequency of the order of Hz (in the experimented prototypes it has been preferred a frequency between about 1,5 Hz and 110 Hz). The use of a low frequency is justified by the fact that otherwise the capacities and the inductances of the line would produce errors in the measurements proportional to the frequency value.

The generator 17 generates simultaneously also a continuous current (which is superimposed to the alternate current) and which has the task of depolarizing some layers of the soil behaving like electrolytic cells which cause noticeable difficulties for the flow of electric current.

The voltmeter 19 is provided with a filter which is centered on the frequency of the current generator but also performs a demodulation with a synchronism circuit with the emitted frequency, in order to allow an improved signal to noise ratio and to render disregardable the "ripple" in the measuring stability, which would be otherwise impossible to obtain, in view of the low frequencies employed.

The address transmitter block 16 comprises a direct current power supply which has the possibility of re-positioning the polarity on the wire lines as will be described afterwards. Said transmitter may be employed according to usual specifications, as for example the emission type CCITT V21 with a transmission rate of 256 or 512 BPS, provided by the telephone service managing companies.

Figure 3A:
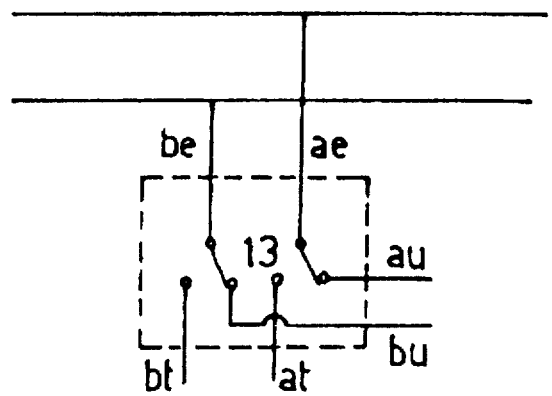
FIG. 3a and FIG. 3b are representation of the possible line connections of the remote controlled actuator indicated by the reference number 3 in FIG. 1.
Figure 3B:
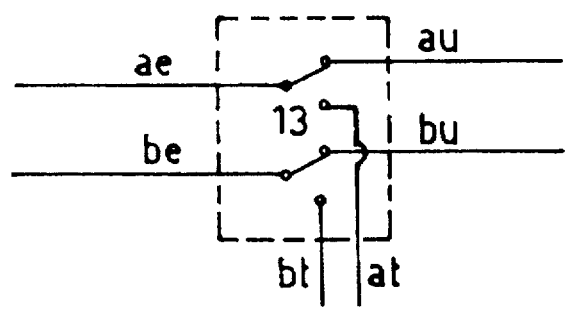

FIGS. 3a and 3b show the ways of connecting the remote controlled actuator 3 along the line. In the first case, according to FIG. 3a, the remote controlled actuator 3 is simply connected in parallel to the line without sectioning it altogether, whereas in the second case of FIG. 3b a sectioning is necessary.

The references used for the terminals are:
ae, be=entering line
au, bu=outgoing line
at, bt=they are connected separately to the ground to be measured, in this manner the ground resistance measure is not increased by the line resistance.

The two systems are equivalent under the operation point of view and in both cases the ground resistance is to be connected to "at" and "bt". Proper switch may be an electromechanical relay or a solid state relay.

A type of control message that can be sent from the centralized measurer 1 affording a good efficiency and reliability in synchronism is that which provides two 8-bit words to be iteratively repeated until the called actuator closes the contacts 13. The first word is formed by 8 bits all set to 1, whereas the second one is formed by a first and last bit always set to 0, and the other six ones which vary according to the transmitted address. With this message it is possible to have sixtyfour different addresses per line, but this number may be simply varied by varying the length of the words.

Figure 4:
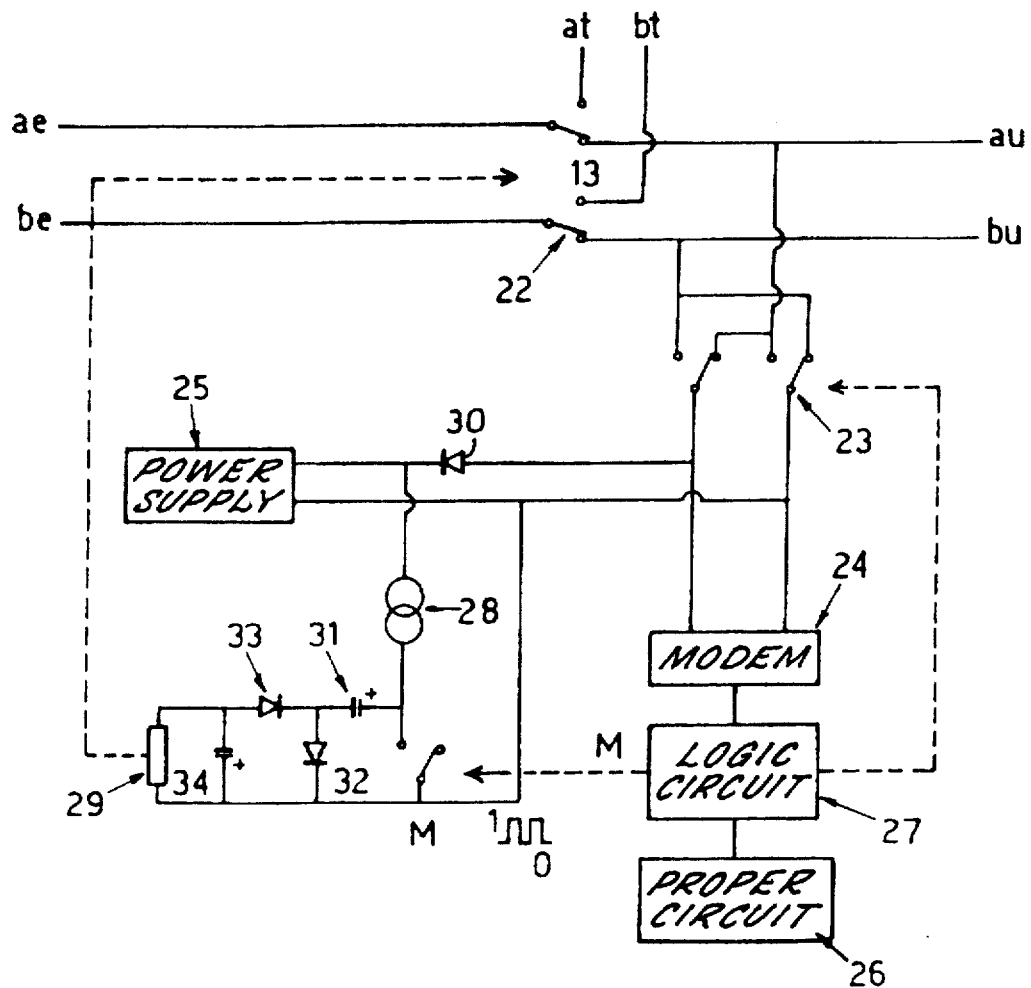
FIG. 4 is a schematical representation of the parts making up the remote controlled actuator indicated by reference 3 of FIG. 1.

In FIG. 4 there is shown the block diagram of the device related to the remote controlled actuator, interfaced to the line by means of a contact 22 already illustrated.

By means of a switch 23, whose functionality will be explained later, the signal emitted by the address transmitter reaches the modem 24 and the voltage supplied by the line power supply reaches the general power supply 25 which stabilizes it for all circuits.

The signal is decoded and sent to the logic circuits 27 to which the two outputs R and 14 are associated.

The output R controls the switch 23 which performs an "autoreverse" function. This function is justified by the fact that the remote controlled actuator is usually installed on a telephone line which is supplied by an exchange. In this condition (inactivity condition) the remote controlled actuator has not to be supplied, in order that the line is not unnecessarily loaded, and this supply is in fact forbidden by the diode 30. When a ground measure has to be performed, the line is switched from the exchange to the centralized measuring device 1, which, through the address transmitter 16 sends an opposite supply (with respect to the exchange) which is transmitted correctly through the diode 30 in order to supply the remote controlled actuator.

It may happen however that because of an incorrect installation or because of a subsequent line inversion caused by a repairer (inversion of the wires "a" and "b") a remote controlled actuator is erroneously supplied. If the remote controlled actuator is correctly supplied without control signal for a predetermined time, the switch 23 will position itself in the absorption condition 0, this is the "AUTOREVERSE" function.

The output M is activated when the transmitted address and the one set by the proper circuit 26 are equal. The signal which exits from M is essentially a square wave whose period is equal to the length of the received message. During the "off" period of said square wave, the switch M is open and the current of the generator 28 can charge the condenser 31 by means of the diode 32. During the "on" period, M is closed and the charge of the condenser 31 is transferred on the condenser 34 by means of the diode 33.

Repeating various times this procedure, the potential difference at the two sides of the condenser 34 will switch the relay 29, which will change over "ae" and "be" on "at" and "bt", so as to allow measuring the ground resistance. At the same time, the remote controlled actuator is no more supplied due to this change over, and the relay 29 will remain attracted until the condenser 34 will be discharged.

The description of the invention in its preferred embodiments has been given only for an exemplificative purpose and by no way as a limitation of the principle based on a system of remote measure of protection grounds.

I claim:

1. A system for the remote measuring of the protection ground comprising a centralized ground measuring device (1) connected to two reference grounds (11, 12) which are connected to the soil (B), at least one remote controlled actuator (3) which comprises two ground terminals (at, bt) connected to the soil (B), and a line selector (2) which connects the centralized ground measuring device (1) with the remote controlled actuator (3), said remote controlled actuator being connected to a selected wire of a two wire (14, 14'; ae, be) measuring line and being provided with contacts (13) to connect the wires of the line (14, 14'; ae, be) to the ground terminals (at, bt) to close a measuring circuit when it recognizes the address emitted by the centralized ground measuring device (1), whereby a ground resistance measurement may be conducted in a measurement region which is distant from the reference grounds so that the deepest layers of soil which can be considered to be at a constant potential are involved in the measurement, and the centralized ground measuring device further comprises an address transmitter (16) emitting a synchronism and recognition signal and for supplying current to the measuring line (14, 14'), a constant current generator (17) for providing a constant current to flow through a first wire of the line (14'), the respective ground terminal of the remote controlled actuator, a ground resistance (RX), and the first reference ground (11) back into the centralized measuring device, passing through a current probe (18) which is suited to detect the closing of the measurement circuit, and a change-over switch (10) connecting the second wire (14) of the line either to a second output of the address transmitter (16), a first output of which is connected to the first wire (14') of the line, or to a second input of a selective voltmeter (19) a first input of which is connected to a second reference ground (12).

2. A system for the remote measuring of the protection ground according to claim 1, characterized in that the current generator (17) generates a relatively low frequency alternating current.

3. A system for the remote measuring of the protection ground according to claim 2, characterized in that the current generator (17) generates a direct current superimposed on the alternating current.

4. A system for the remote measuring of the protection ground according to claim 1, characterized in that the voltmeter (19) is selected for the frequency of the current generator (17) and performs a demodulation which is synchronous with the emitted frequency.

5. A system for remote measuring of the protection ground according to the claim 1, wherein the remote controlled actuator (3) further comprises a switch (22) connected in the measuring line (ae, be) for connecting the measuring line to an outgoing line (au, bu), and a further switch (23) in the outgoing line leading a circuit which includes a general power supply (25), a direct current generator (28), a blocking diode (30), a modem (24) and a circuit for setting the address (26) of the remote controlled actuator and a logic circuit interfaced with a network comprising two condensers (31 and 34) and two further diodes (33 and 32) for actuating a relay (29), with the charge which is stored in the first condenser and which has been transferred thereto through the first further diode (33), when the transmitted address and the set address are equal, said circuit being an intrinsically safe device, since it is guaranteed that the relay (29) is not actuated in presence of any kind of failure.

6. A system for remote measuring of the protection ground according to claim 5, wherein the measuring line is connected to a telephone exchange, and wherein the remote controlled actuator has a configuration such that no current flows from the measuring line (ae, be) through the blocking diode (30), to the remote controlled actuator (3) when the measuring line is supplied at a normal polarity, and in such a way that to perform a ground measurement, the measuring line is switched from the exchange to the centralized measuring device (1), which through the address transmitter (16) sends a supply of opposite polarity with respect to the exchange, which is transmitted correctly through the diode (30) in order to supply the remote controlled actuator and which is employed for activating the ground measurement, which is effectively completely performed only if the transmitted and the set address are equal, wherein the switch (23) is arranged to change the polarity of the connection of the remote controlled actuator block (3) and the blocking diode (30) comprised therein to the measuring line (ae, be) and is switched to a position in which no current flows from the measuring line through the blocking diode (30) to the remote controlled actuator (3), when the actuator is supplied for a well defined period of time without receiving a control signal transmitted by the address transmitter (16).

7. A method for the remote measuring of the protection ground, comprising the steps wherein:

an address transmitter in a centralized ground measuring device (1) which is connected to two reference grounds (11, 12) which are connected to the soil (B) emits a synchronism and recognition signal with the specific address of a remote controlled activator (3) connected to a measuring line (14, 14') selected by a line selector (2) and comprising two ground terminals (at, bt) which are connected to the soil, and simultaneously current is supplied to said remote controlled actuator (3) which is located near a region where a ground measurement is required, whereby a ground resistance measurement is done in a measurement region which is distant from the reference grounds, so that the deepest layers of soil which can be considered to be at a constant potential are involved in the measurement, when the remote controlled actuator (3) is supplied and following the recognition of the transmitted address and the one set by a proper circuit (26) in the actuator (3) are equal, it closes the contacts (13) which are provided for closing a measurement circuit, a constant current (I) generated by the constant current generator (17) comprised in the centralized ground measuring device (1) with an alternating component of relatively low frequency and a direct component flows from the centralized ground measurement device, through a first wire of the line (14'), the respective ground terminal of the remote controlled actuator, the ground resistance and the first reference ground (11) back into the centralized measuring device, passing through the current probe (18), which is suited to detect the closing of the measurement circuit, an actual measurement of the ground resistance following the commutation of the change-over switch (10) comprised in the centralized ground measuring device, is performed on the basis of the detection by means of the selective voltmeter (19) also comprised in the centralized ground measuring device of a voltage which is directly proportional to the ground resistance, the change-over switch being switched to a position connecting the second wire of the line to a second input of the selective voltmeter (19) a first input of which is connected to the second reference ground (12).

* * * * *